United States Patent
Shih et al.

(10) Patent No.: US 11,950,408 B2
(45) Date of Patent: Apr. 2, 2024

(54) SEMICONDUCTOR STRUCTURE AND METHOD OF MANUFACTURING THE SAME

(71) Applicant: NANYA TECHNOLOGY CORPORATION, New Taipei (TW)

(72) Inventors: Chiang-Lin Shih, New Taipei (TW); Hsueh-Han Lu, New Taipei (TW); Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 73 days.

(21) Appl. No.: 17/653,658

(22) Filed: Mar. 7, 2022

(65) Prior Publication Data
US 2023/0284437 A1 Sep. 7, 2023

(51) Int. Cl.
H10B 12/00 (2023.01)

(52) U.S. Cl.
CPC .......... *H10B 12/485* (2023.02); *H10B 12/09* (2023.02); *H10B 12/34* (2023.02); *H10B 12/50* (2023.02)

(58) Field of Classification Search
CPC .... H10B 12/0335; H10B 12/09; H10B 12/34; H10B 12/485; H10B 12/50
See application file for complete search history.

(56) References Cited

U.S. PATENT DOCUMENTS

| 2005/0253179 A1* | 11/2005 | Park ............ H10B 12/033 257/E27.088 |
| 2018/0226303 A1 | 8/2018 | Won |
| 2020/0161294 A1 | 5/2020 | Lee |

\* cited by examiner

*Primary Examiner* — Meiya Li
(74) *Attorney, Agent, or Firm* — CKC & Partners Co., LLC

(57) ABSTRACT

A method of manufacturing a semiconductor structure is provided. A conductive layer is formed on a precursor memory structure. A target layer is formed on the conductive layer. A first photoresist with a first opening is formed on the target layer. A spacer is formed on sidewalls of the first opening. A second photoresist with a second opening is formed on the target layer and the spacer. The target layer is patterned by the second photoresist and the spacer to form a first patterned target layer. A third photoresist with a third opening is formed on the first patterned target layer. The first patterned target layer is patterned by the third photoresist to form a second patterned target layer. The conductive layer is patterned by the second patterned target layer to form a patterned conductive layer including a ring structure aligned with a source/drain region.

9 Claims, 29 Drawing Sheets

SEMICONDUCTOR STRUCTURE AND METHOD OF MANUFACTURING THE SAME

BACKGROUND

Field of Invention

The present disclosure relates to a semiconductor structure and method of manufacturing the same. More particularly, the present disclosure relates to a semiconductor structure of a dynamic random access memory (DRAM).

Description of Related Art

With the advancement of semiconductor techniques, the size of semiconductor memory devices has become smaller, which has led to an increase in the integration of semiconductor memory devices. In other words, more functional devices can be integrated on the same chip. In this case, the critical dimension of the semiconductor memory device is also reduced, so that the electronic product may be more compact. However, as the critical dimension of the device gets smaller, semiconductor process techniques will face many challenges. For example, since the elements of the semiconductor device have become smaller, the alignment between the elements on different layers of the device also became more difficult.

SUMMARY

In accordance with an aspect of the present disclosure, a method of manufacturing a semiconductor structure is provided. A conductive layer is formed on a precursor memory structure, where the precursor memory structure includes a plurality of transistors and a plurality of contact plugs disposed on and connected to the transistors. A target layer is formed on the conductive layer. A first photoresist with a first opening is formed on the target layer, where the first opening includes a trench above a first contact plug of the contact plugs. A spacer is formed on sidewalls of the first opening of the first photoresist. The first photoresist is removed, and the spacer is remained on the target layer. A second photoresist with a second opening is formed on the target layer and the spacer, where a portion of the spacer and the target layer in an array circuit region are exposed by the second opening. The target layer is patterned by the second photoresist and the spacer to form a first patterned target layer. A third photoresist with a third opening is formed on the first patterned target layer, where the first patterned target layer in a periphery circuit region is exposed by the third opening. The first patterned target layer is patterned by the third photoresist to form a second patterned target layer. The conductive layer is patterned by the second patterned target layer to form a patterned conductive layer on the precursor memory structure, where the patterned conductive layer includes a ring structure above the first contact plug, and the ring structure is aligned with a first source/drain region below the first contact plug.

In some embodiments, forming the spacer on the sidewalls of the first opening includes forming the spacer in the trench of the first opening, and portions of the spacer on opposite sides of the trench are formed without contacting each other.

In some embodiments, forming the spacer on the sidewalls of the first opening includes forming the spacer with a width between 26 nm and 30 nm.

In some embodiments, the portion of the spacer exposed by the second opening includes the spacer formed in the trench of the first opening.

In some embodiments, forming the second photoresist on the target layer and the spacer includes forming the second photoresist covering another portion of the spacer, a distance between a sidewall of the second photoresist and a sidewall of the portion of the spacer covered by the second photoresist is between 50 nm to 100 nm.

In some embodiments, forming the second photoresist on the target layer and the spacer includes forming the second photoresist covering the target layer in the periphery circuit region.

In some embodiments, the first patterned target layer includes a ring portion above the first contact plug, and the ring portion is aligned with a first source/drain region below the first contact plug.

In some embodiments, the method further includes forming a fourth photoresist with a fourth opening on the first patterned target layer before forming the third photoresist, where a portion of the first patterned target layer in the array circuit region is exposed by the fourth opening, and the fourth photoresist covers the ring portion of the first patterned target layer. The first patterned target layer is patterned by the fourth photoresist without patterning the ring portion.

In some embodiments, forming the third photoresist on the first patterned target layer includes forming the third photoresist covering the ring portion of the first patterned target layer.

In some embodiments, forming the third photoresist on the first patterned target layer includes forming the third photoresist covering the first patterned target layer in the array circuit region.

In some embodiments, the target layer includes nitride, and the spacer includes oxide.

In accordance with an aspect of the present disclosure, a semiconductor structure is provided. The semiconductor structure includes a plurality of transistors, an interlayer dielectric layer, a plurality of contact plugs, and a patterned conductive layer. The transistors are disposed in a substrate, where each of the transistors includes a gate structure and source/drain regions disposed at opposite sides of the gate structure. The interlayer dielectric layer is disposed above the substrate. The contact plugs are disposed in the interlayer dielectric layer, where each of the contact plugs is electrically connected to one of the source/drain regions. The patterned conductive layer is disposed on the interlayer dielectric layer and electrically connected to the transistors through the contact plugs, where the patterned conductive layer includes a ring structure above a first contact plug of the contact plugs, and the ring structure is aligned with a first source/drain region below the first contact plug.

In some embodiments, the first contact plug is exposed by the ring structure.

In some embodiments, the first source/drain region is surrounded by a projection of the ring structure on the substrate.

In some embodiments, the ring structure is partially overlapped with the first contact plug.

In some embodiments, a width of the ring structure is between 26 nm and 30 nm.

In some embodiments, the semiconductor structure further includes a plurality of bit lines disposed over the substrate and a plurality of bit line contact plugs disposed between the substrate and the bit lines, where the bit lines are electrically connected to the source/drain regions disposed between two of the contact plugs through the bit line contact plugs.

In some embodiments, the patterned conductive layer is overlapped with the bit line contact plugs.

In some embodiments, the patterned conductive layer is electrically connected to the source/drain regions through the contact plugs.

In some embodiments, the patterned conductive layer is connected to a power supply.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
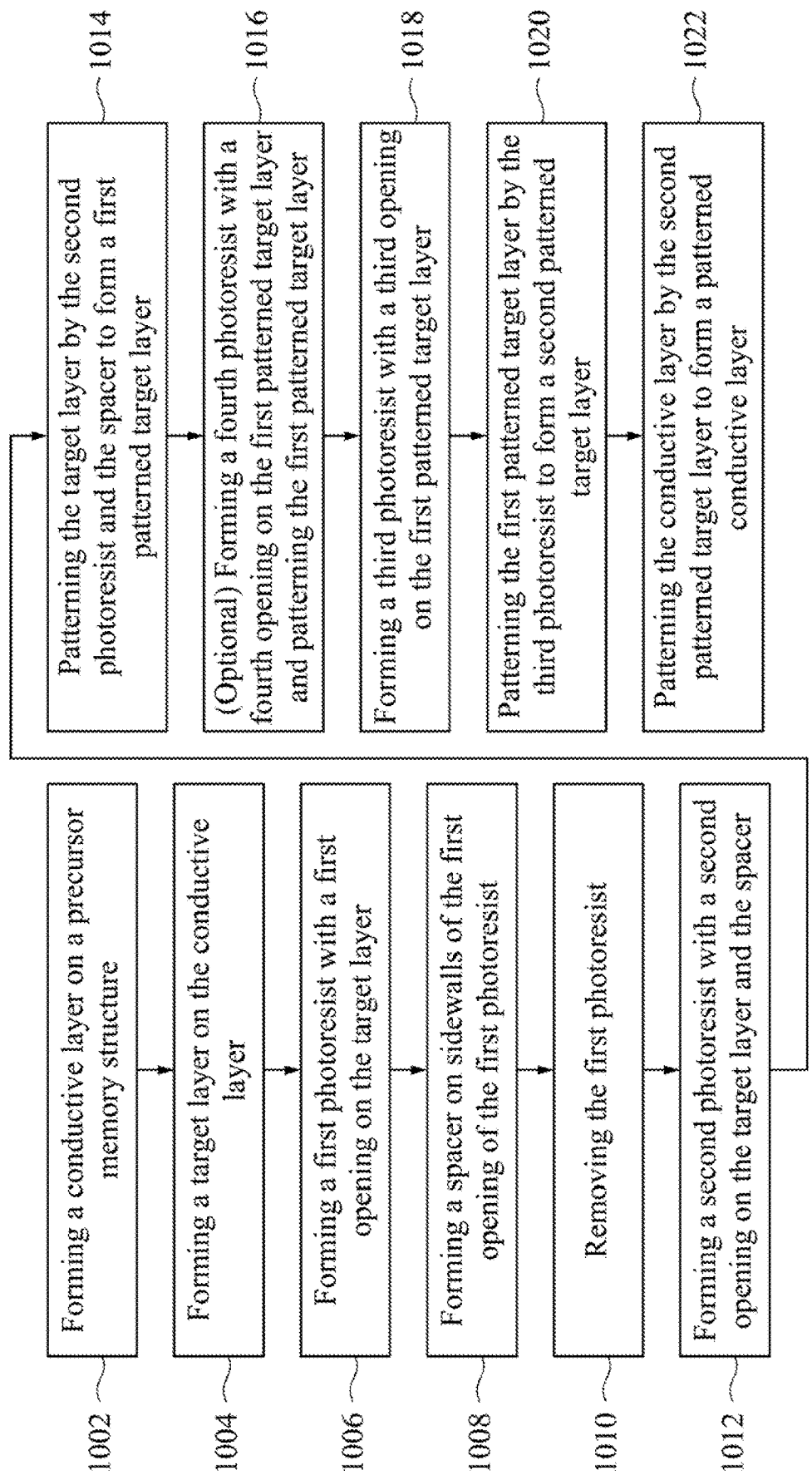
FIG. 1 is a flow chart illustrating a method of manufacturing a semiconductor structure according to some embodiments of the disclosure.

The following disclosure provides many different embodiments, or examples, for implementing different features of the provided subject matter. Specific examples of components, values, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure and a manufacturing method thereof. The semiconductor structure includes a patterned conductive layer disposed on a precursor memory structure, in which the patterned conductive layer includes a ring structure above a contact plug of the precursor memory structure, and the ring structure is aligned with a source/drain region below the contact plug. Since the ring structure is aligned with one of the source/drain regions of the precursor memory structure, the other portions of the patterned conductive layer are able to be correspondingly aligned with other elements of the precursor memory structure. This provides a well alignment between the patterned conductive layer and the precursor memory structure below, which reduces the current leakage between them.

FIG. 1 is a flow chart illustrating a method of manufacturing a semiconductor structure according to some embodiments of the disclosure. As shown in FIG. 1, the method 1000 includes operation 1002 to operation 1022. The details of the method 1000 for manufacturing the semiconductor structure will be further described according to one or more embodiments below.

Figure 2:
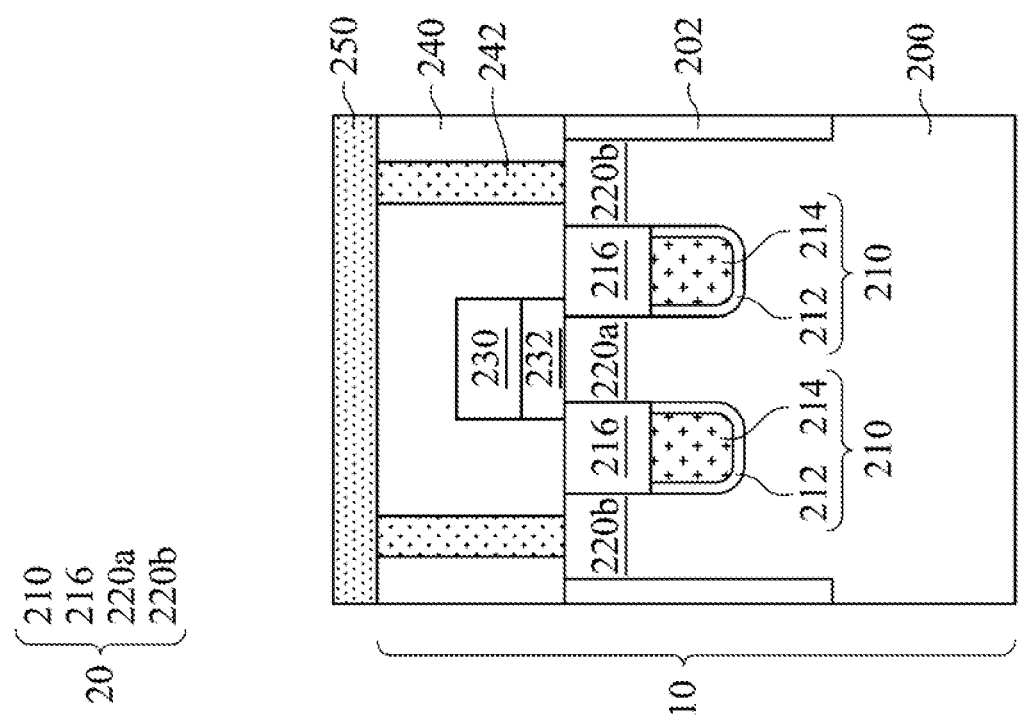
FIG. 2 is a cross-sectional view of an intermediate stage in the manufacturing of semiconductor structure according to some embodiments of the disclosure.

FIG. 2 is a cross-sectional view of an intermediate stage in the manufacturing of semiconductor structure according to some embodiments of the disclosure. Referring to FIG. 1 and FIG. 2, in the operation 1002 of the method 1000, a conductive layer 250 is formed on a precursor memory structure 10. Specifically, the precursor memory structure 10 includes a plurality of transistors 20 disposed in a substrate 200, an interlayer dielectric (ILD) layer 240 on the transistors 20, and a plurality of contact plugs 242 disposed in the interlayer dielectric layer 240. In other words, the contact plugs 242 are disposed above the transistors 20 and electrically connected to the transistors 20. The conductive layer 250 is formed on the interlayer dielectric layer 240 to cover the interlayer dielectric layer 240 and the contact plugs 242. The conductive layer 250 is in contact with the contact plugs 242. In some embodiments, the conductive layer 250 may include conductive material, such as tungsten (W), aluminum (Al), titanium (Ti), titanium nitride (TiN), cobalt (Co), or the like.

In some embodiments, the substrate 200 may include an array circuit region and a periphery circuit region. For example, the elements in the periphery circuit region may provide input/output current to the transistors 20, while the elements in the array circuit region may provide the functional operation of the precursor memory structure 10. In some embodiments, the substrate 200 may include silicon (Si), silicon germanium (SiGe), silicon carbide (SiC), gallium (Ga), gallium nitride (GaN), gallium arsenide (GaAs), a combination thereof, or the like. A neutral type, n-type, or p-type doped well region (not shown) may be formed in the substrate 200, depending on the conductivity type of the transistor structure formed thereafter. Shallow trench isolation (STI) structures 202 may be formed in the substrate 200 for defining at least one active region, for example, the active region 204 shown in FIG. 15A.

In some embodiments, the transistor 20 of the precursor memory structure 10 may include a gate structure 210 and source/drain (S/D) regions 220a and 220b disposed at opposite sides of the gate structure 210. In some embodiments, the gate structure 210 may be a buried gate structure 210 so that the gate structure 210 may serve a buried word line (BWL) for a DRAM device, but is not limited thereto. The gate structure 210 may include a gate electrode 214 and a gate dielectric layer 212 disposed between the substrate 200 and the gate electrode 214. An isolation structure 216 may be formed on the gate structure 210. In some embodiments, the source/drain regions 220a and 220b may be n-type or p-type doped regions, depending on the conductivity type of the transistor structure to be formed. As shown in FIG. 2, two gate structures 210 may share one source/drain region 220a.

In some embodiments, as shown in FIG. 2, the interlayer dielectric layer 240 disposed above the substrate 200 may be a single-layered structure. In other embodiments, the interlayer dielectric layer 240 may be a multi-layered structure. The contact plugs 242 are embedded in the interlayer dielectric layer 240 and formed on the source/drain regions 220b. As such, each contact plug 242 is electrically connected to one of the source/drain regions 220b. A plurality of bit line structures 230 are further formed in the interlayer dielectric layer 240. In some embodiments, the precursor memory structure 10 may further include a bit line 230 disposed over the substrate 200 and a bit line contact plug 232 disposed between the source/drain region 220a and the bit line 230. The bit line 230 may be electrically connected to the source/drain region 220a between two contact plugs 242 through the bit line contact plug 232. As a result, the substrate 200, the contact plugs 242 and the bit line 230 are covered by the interlayer dielectric layer 240. It should be understood that FIG. 2 shows one bit line 230 in the precursor memory structure 10, however, the precursor memory structure 10 may include more than one bit lines 230 and their corresponding bit line contact plugs 232.

In the following operation 1004 to operation 1022 of the method 100, the conductive layer 250 on the precursor memory structure 10 is patterned to form a patterned conductive layer, such as the patterned conductive layer 252 shown in FIG. 15A, of the semiconductor structure. To clearly illustrate the details of implementing the operations, FIGS. 3A-14B are simplified to show only the structures above the interlayer dielectric layer 240 of various intermediate stages in the manufacturing of semiconductor structure. In other words, the interlayer dielectric layer 240 in FIGS. 3A-14B may represent the precursor memory structure 10 shown in FIG. 2, which the following operations are performed thereon.

Figure 3A:
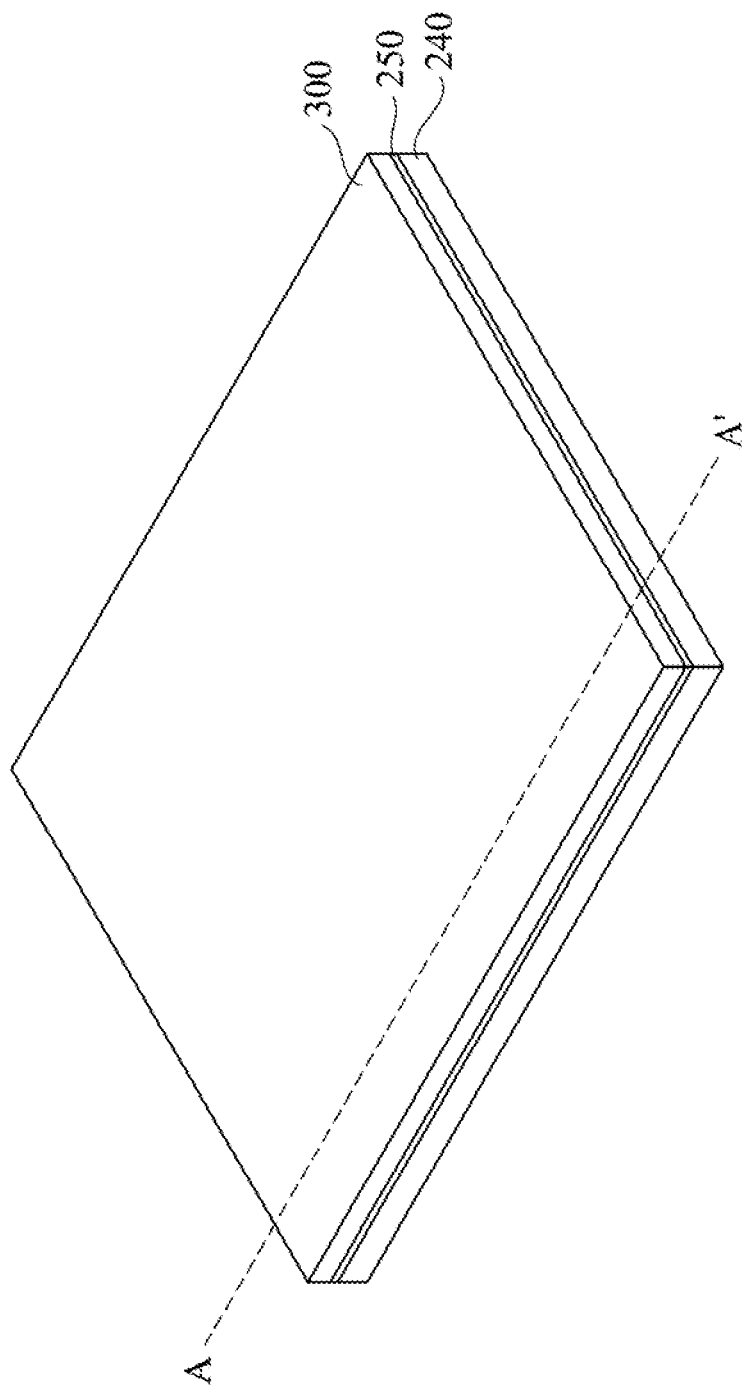
FIGS. 3A, 4A, 5A, 6A, 7A, 8A, 9A, 10A, 11A, 12A, 13A, and 14A are perspective views of various intermediate stages in the manufacturing of semiconductor structure according to some embodiments of the disclosure.
Figure 3B:
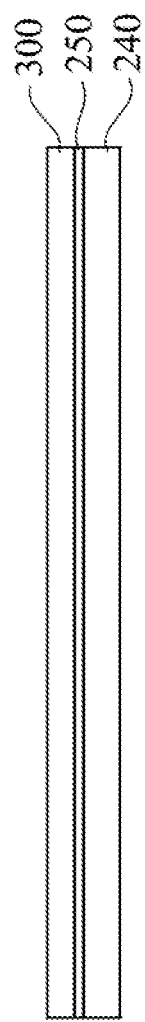
FIGS. 3B, 4B, 5B, 6B, 7B, 7D, 8B, 9B, 10B, 11B, 12B, 13B, and 14B are cross-sectional views of various intermediate stages in the manufacturing of semiconductor structure according to some embodiments of the disclosure.

FIG. 3A is a perspective view of one of various intermediate stages in the manufacturing of semiconductor structure according to some embodiments of the disclosure. FIG. 3B is a cross-sectional view taken along line A-A' of FIG. 3A. Referring to FIG. 1 and FIGS. 3A-3B, in the operation 1004 of the method 1000, a target layer 300 is formed on the conductive layer 250. Specifically, the target layer 300 is formed on the conductive layer 250 as a blanket layer. The target layer 300 would later be patterned to include a pattern of the array circuit and another pattern of the periphery circuit. In some embodiments, the target layer 300 may include nitride, such as silicon nitride or the like, formed by a chemical vapor deposition (CVD) process.

Figure 4A:
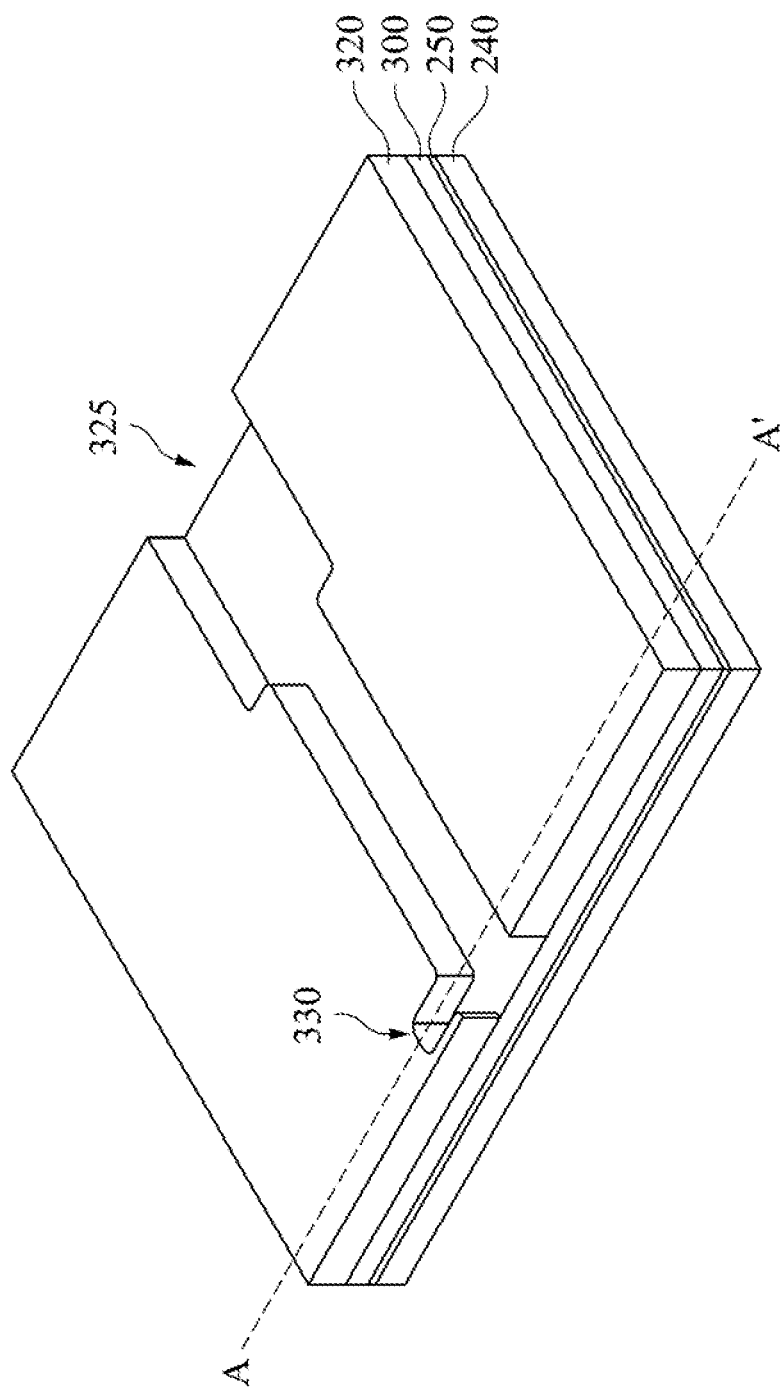
Figure 4B:
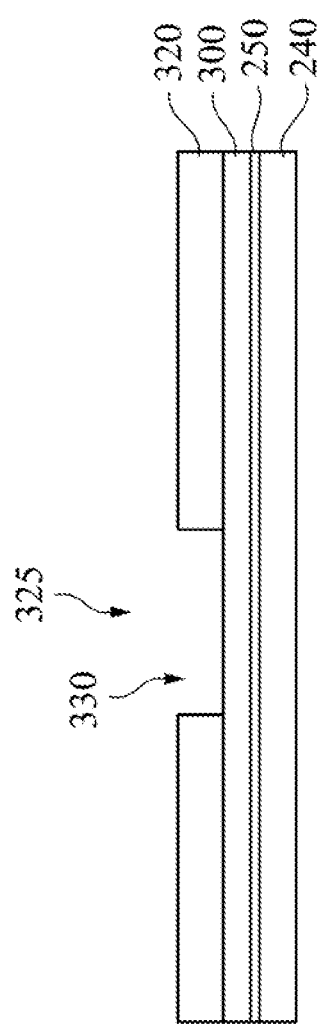

FIG. 4A is a perspective view of one of various intermediate stages in the manufacturing of semiconductor structure according to some embodiments of the disclosure. FIG. 4B is a cross-sectional view taken along line A-A' of FIG. 4A. Referring to FIG. 1 and FIGS. 4A-4B, in the operation 1006 of the method 1000, a first photoresist 320 with a first opening 325 is formed on the target layer 300. As shown in FIGS. 4A-4B, a portion of the target layer 300 is exposed by the first opening 325. Specifically, the first opening 325 includes a trench 330 above a contact plug of the precursor memory structure, for example, the contact plug 242 shown in FIG. 2. In other words, the target layer 300 above the contact plug of the precursor memory structure is exposed by the trench 330. More specifically, the trench 330 of the first opening 325 is aligned with the contact plug and the source/drain region below. In some embodiments, the first photoresist 320 may be a single-layered structure. In other embodiments, the first photoresist 320 may be a multi-layered structure.

Figure 5A:
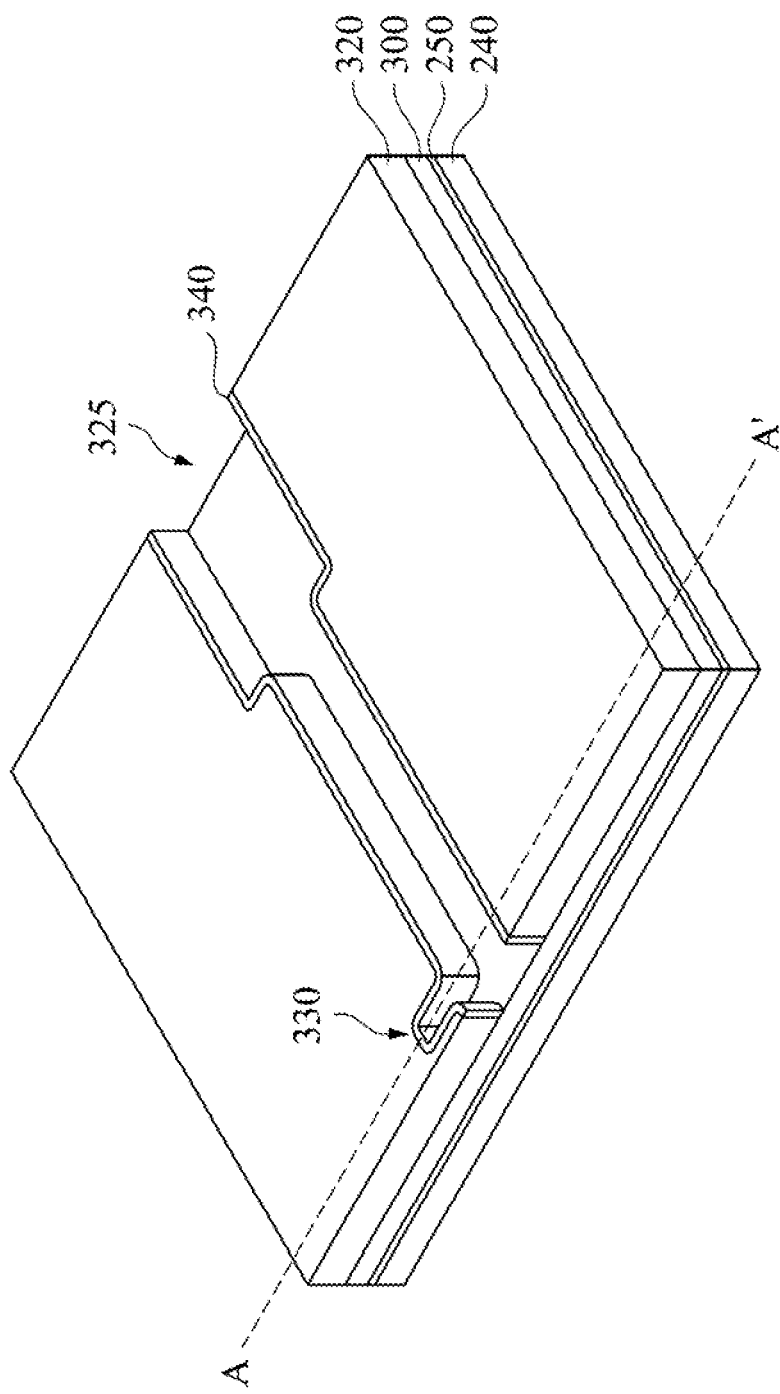
Figure 5B:
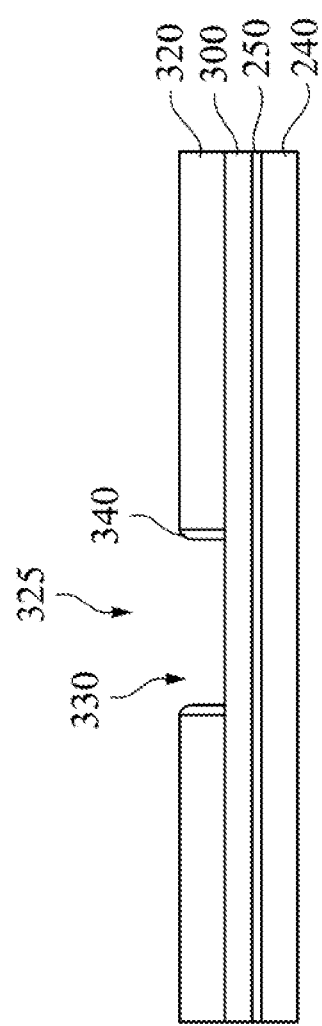

FIG. 5A is a perspective view of one of various intermediate stages in the manufacturing of semiconductor structure according to some embodiments of the disclosure. FIG. 5B is a cross-sectional view taken along line A-A' of FIG. 5A. Referring to FIG. 1 and FIGS. 5A-5B, in the operation 1008 of the method 1000, a spacer 340 is formed on the sidewalls of the first opening 325 of the first photoresist 320. Specifically, the spacer 340 is formed along the sidewalls of the first opening 325 so that the spacer 340 is conformal to the profile of the first opening 325. In some embodiments, the spacer 340 may be formed in the trench 330 of the first opening 325, where portions of the spacer 340 on opposite sides of the trench 330 are formed without contacting each other. As the trench 330 of the first opening 325 is aligned with the contact plug of the precursor memory structure, the spacer 340 may also be aligned with the contact plug and the source/drain regions below. In some embodiments, the spacer 340 on the sidewalls of the first opening 325 may have a width between 26 nm and 30 nm. As a result, when the pattern with the width of the spacer 340 is transferred to the target layer 300, the pattern of the target layer 300 would have suitable size to align with the source/drain regions of the precursor memory structure. This will be subsequently described in greater detail in the following description. In some embodiments, the spacer may include oxide, such as silicon oxide or the like, formed by an atomic layer deposition (ALD) process. In some embodiments, the spacer 340 may have a tapered shape with a round top corner, as shown in FIG. 5B.

Figure 6A:
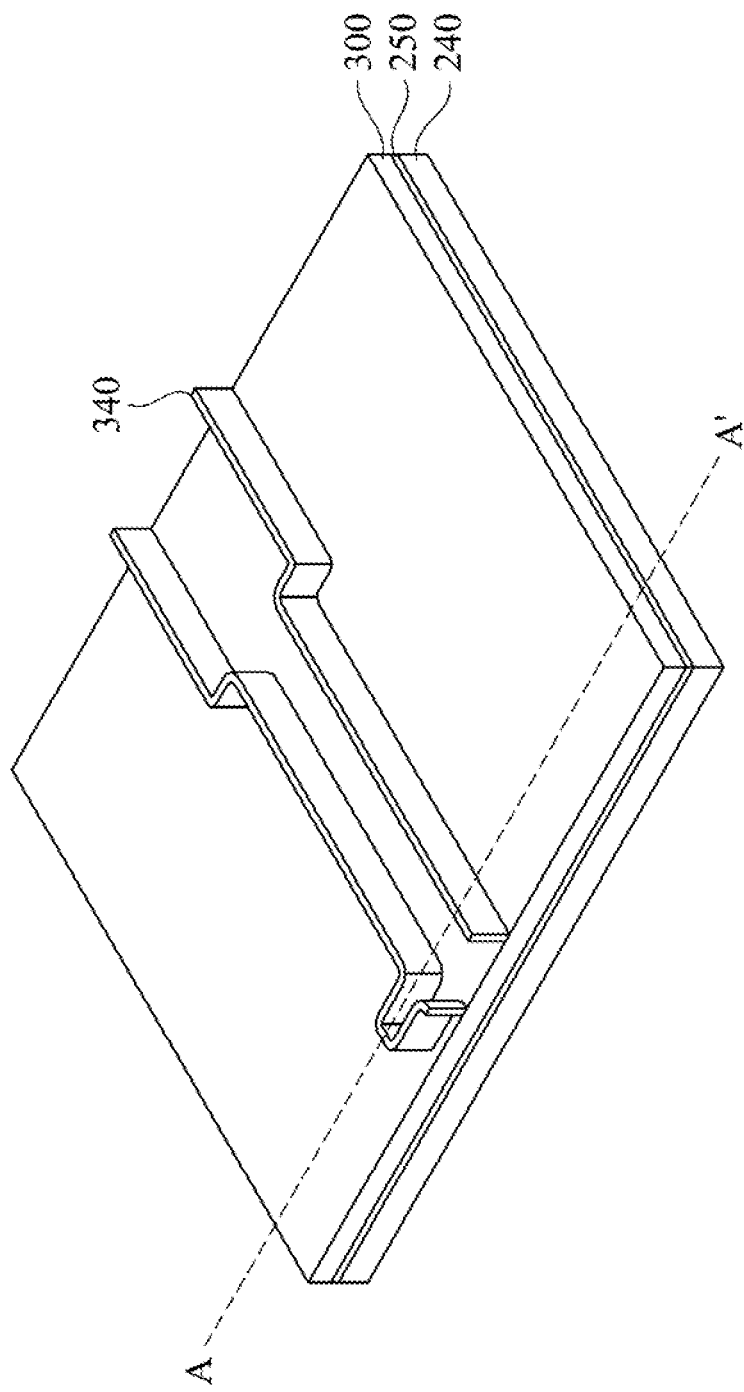
Figure 6B:
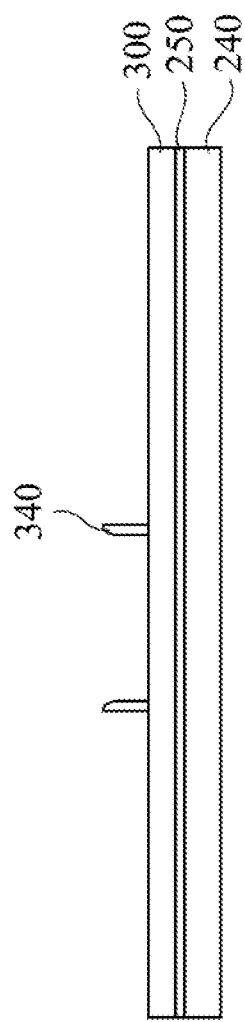

FIG. 6A is a perspective view of one of various intermediate stages in the manufacturing of semiconductor structure according to some embodiments of the disclosure. FIG. 6B is a cross-sectional view taken along line A-A' of FIG. 6A. Referring to FIG. 1 and FIGS. 6A-6B, in the operation 1010 of the method 1000, the first photoresist 320 is removed from the semiconductor structure. In contrast, the spacer 340 is remained on the target layer 300 for the patterning process later.

Figure 7A:
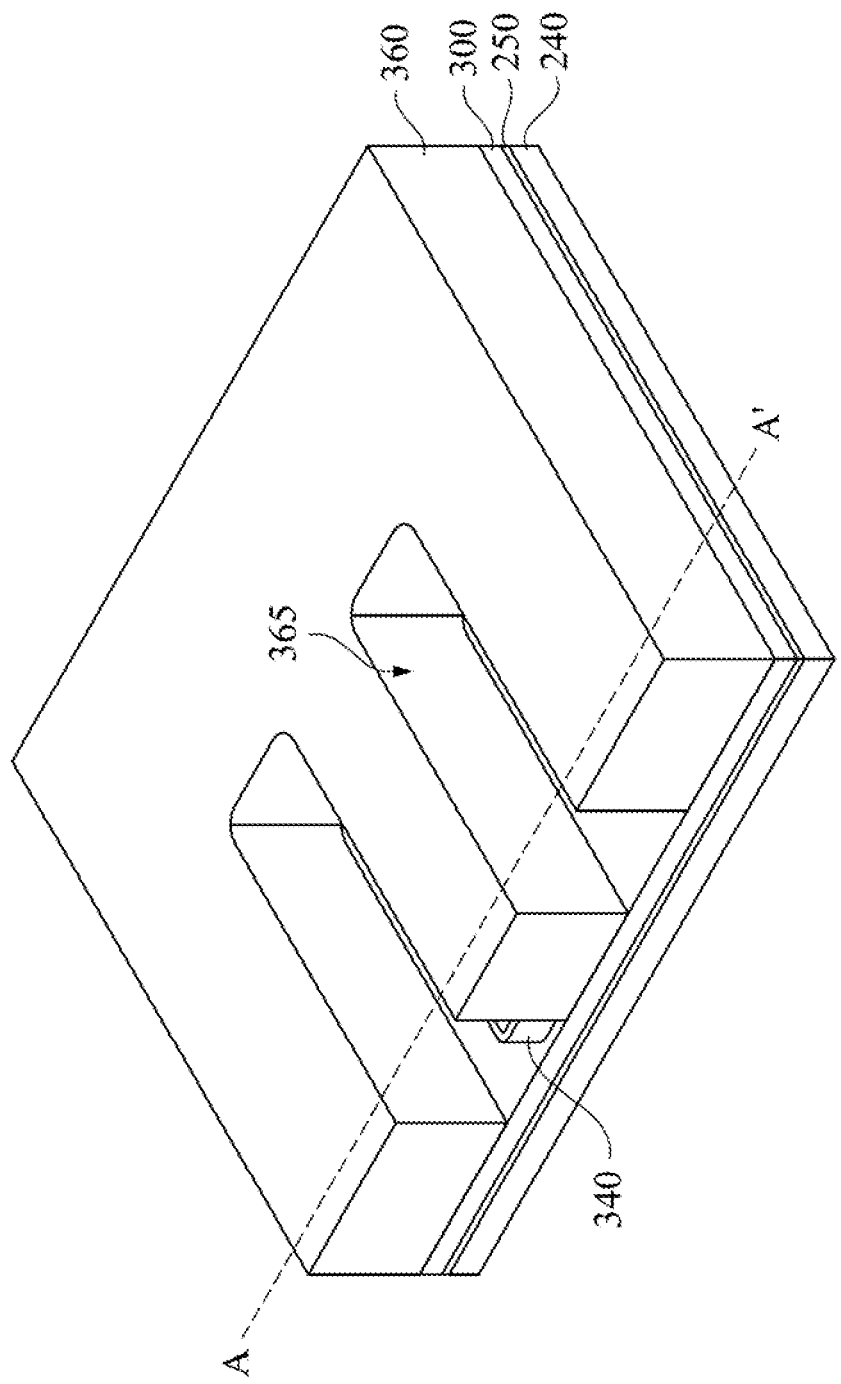
Figure 7B:
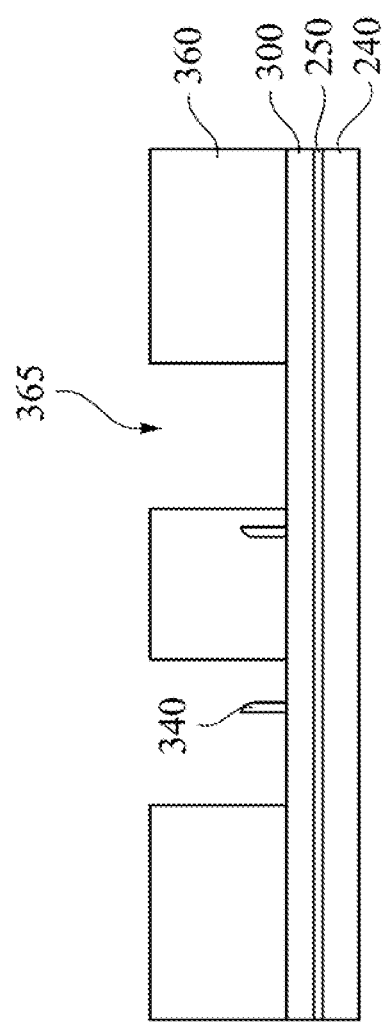

FIG. 7A is a perspective view of one of various intermediate stages in the manufacturing of semiconductor structure according to some embodiments of the disclosure. FIG. 7B is a cross-sectional view taken along line A-A' of FIG. 7A. Referring to FIG. 1 and FIGS. 7A-7B, in the operation 1012 of the method 1000, a second photoresist 360 with a second opening 365 is formed on the target layer 300 and the spacer 340. As shown in FIGS. 7A-7B, a portion of the spacer 340 and a portion of the target layer 300 are exposed by the second opening 365. Specifically, the portion of the target layer 300 exposed by the second opening 365 includes the target layer 300 in the array circuit region of the precursor memory structure. In some embodiments, while the target layer 300 in the array circuit region is exposed by the second opening 365, the target layer 300 in the periphery circuit region of the precursor memory structure may be covered by the second photoresist 360.

Figure 7C:
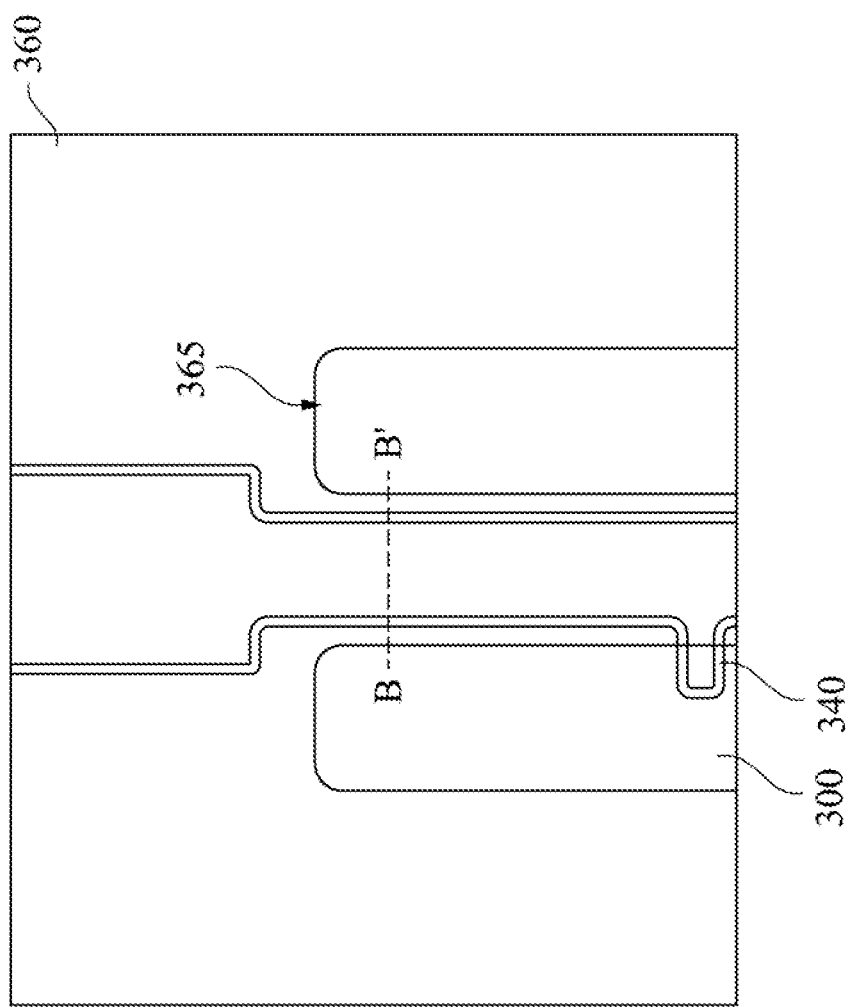
FIG. 7C is a top view of an intermediate stage in the manufacturing of semiconductor structure according to some embodiments of the disclosure.
Figure 7D:
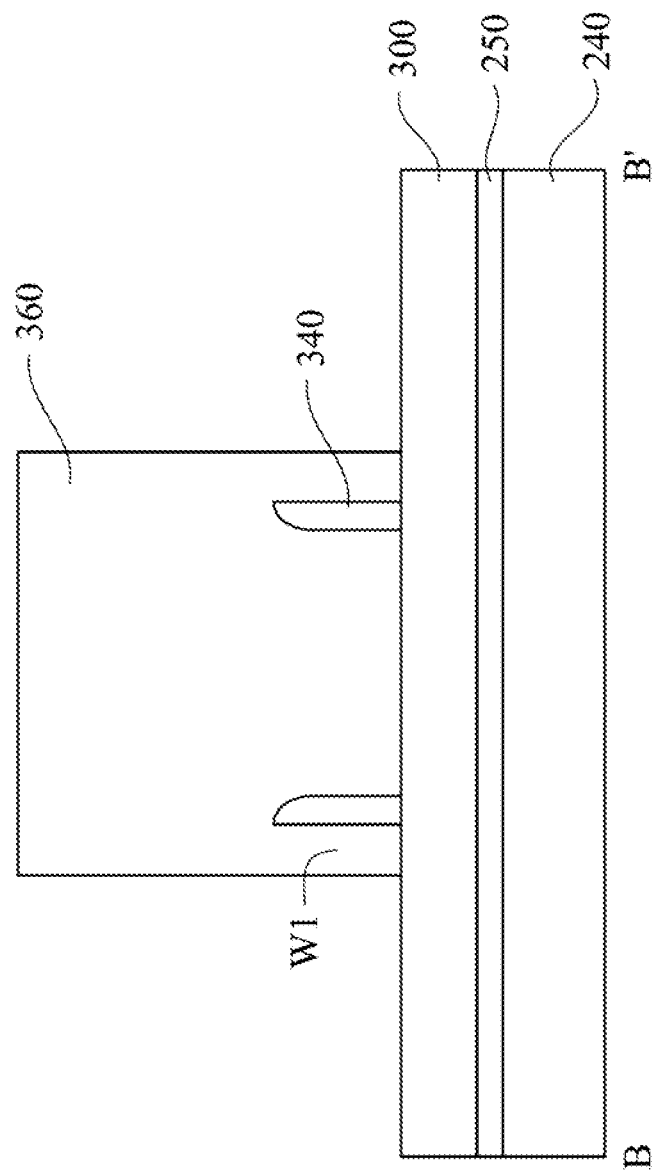

In addition, the portion of the spacer 340 exposed by the second opening 365 includes the spacer 340 formed in the trench 330 of the first opening 325 shown in FIG. 5A. FIG. 7C shows a top view of the semiconductor structure in FIG. 7A. FIG. 7D is a cross-sectional view taken along line B-B' of FIG. 7C. Referring to FIGS. 7C-7D, the spacer 340 formed in the trench 330 of the first opening 325 is exposed by the second opening 365. In some embodiments, while the spacer 340 formed in the trench 330 is exposed by the second opening 365, another portion of the spacer 340 may be covered by the second photoresist 360. As shown in FIG. 7D, the width of the second photoresist 360 may be larger than the distance between two portions of the spacer 340, so that the two portions of the spacer 340 are covered by the second photoresist 360. In some embodiments, a distance W1 between a sidewall of the second photoresist 360 and a sidewall of the spacer 340 covered by the second photoresist 360 may be between 50 nm to 100 nm. If the distance W1 between the sidewall of the second photoresist 360 and the sidewall of the covered spacer 340 is smaller than 50 nm, the portion of the spacer 340 expected to be covered may be exposed by the second opening 365 due to the process tolerance. This would affect the pattern later transferred to the target layer 300.

Figure 8A:
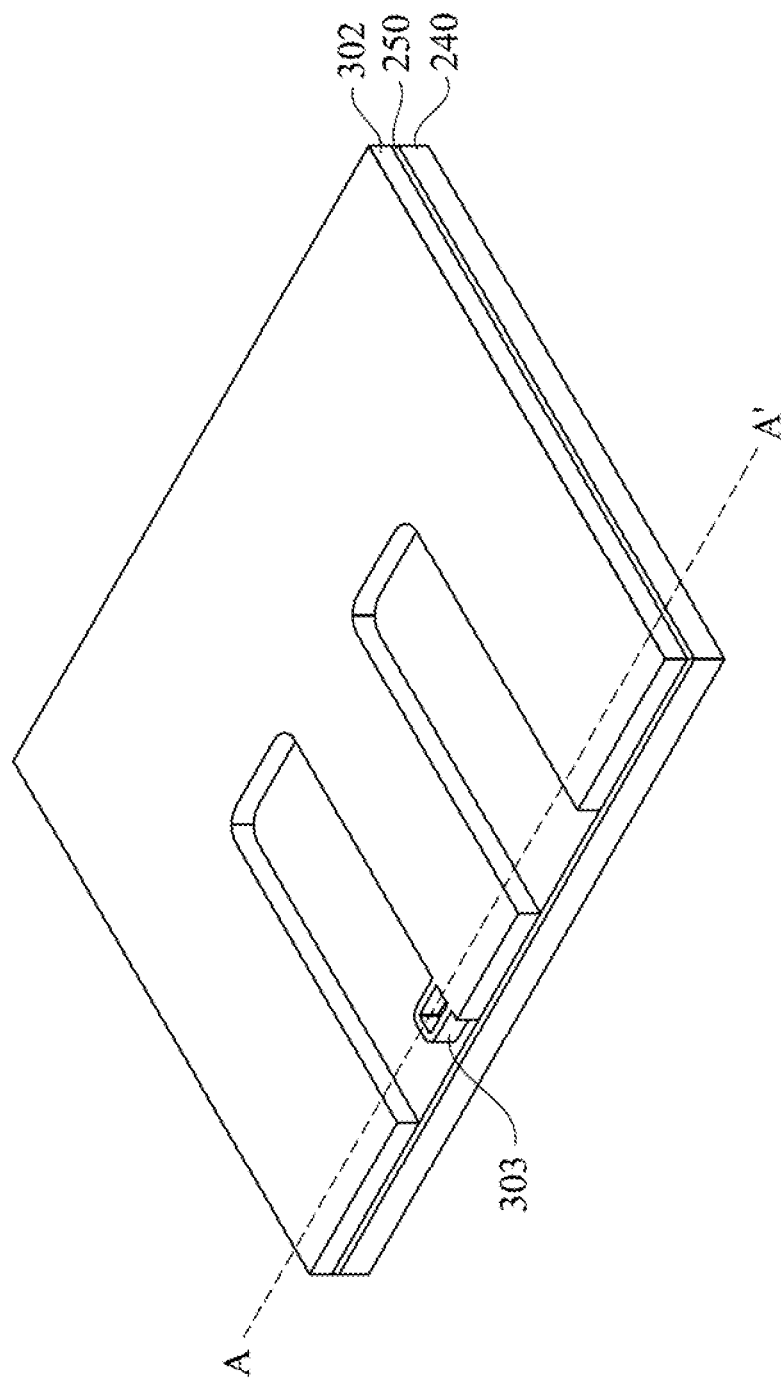
Figure 8B:
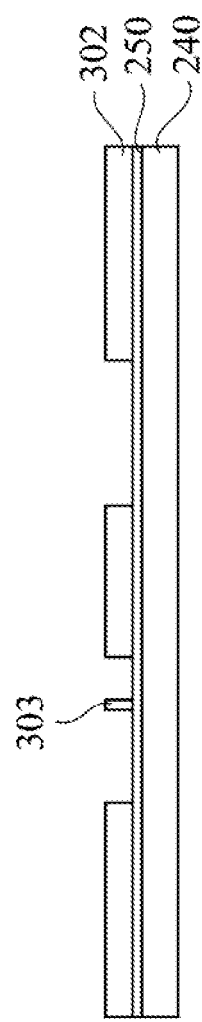

FIG. 8A is a perspective view of one of various intermediate stages in the manufacturing of semiconductor structure according to some embodiments of the disclosure. FIG. 8B is a cross-sectional view taken along line A-A' of FIG. 8A. Referring to FIG. 1 and FIGS. 8A-8B, in the operation 1014 of the method 1000, the target layer 300 is patterned by the second photoresist 360 and the spacer 340 to form a first patterned target layer 302. As such, a portion of the conductive layer 250 is exposed by the first patterned target layer 302. After the formation of the first patterned target layer 302, the second photoresist 360 and the spacer 340 are then removed. In some embodiments, since the spacer 340 formed in the trench 330 of the first opening 325 shown in FIG. 5A is exposed by the second opening 365, the target layer 300 under this portion of the spacer 340 may not be removed. As a result, the first patterned target layer 302 may include a ring portion 303 above the contact plug of the precursor memory structure, for example, the contact plug 242 shown in FIG. 2. In other words, the ring portion 303 may be aligned with the source/drain region below the contact plug. In some embodiments, the ring portion 303 may have a round shape, a U-shape, a rectangular shape with round corner, or other suitable profiles. In some embodiments, the pattern of a portion of the spacer 340 is transferred to the first patterned target layer 302 to form the ring portion 303, so the ring portion 303 may a width similar to that of the spacer 340. For example, the width of the ring portion 303 may be between 26 nm and 30 nm.

Figure 9A:
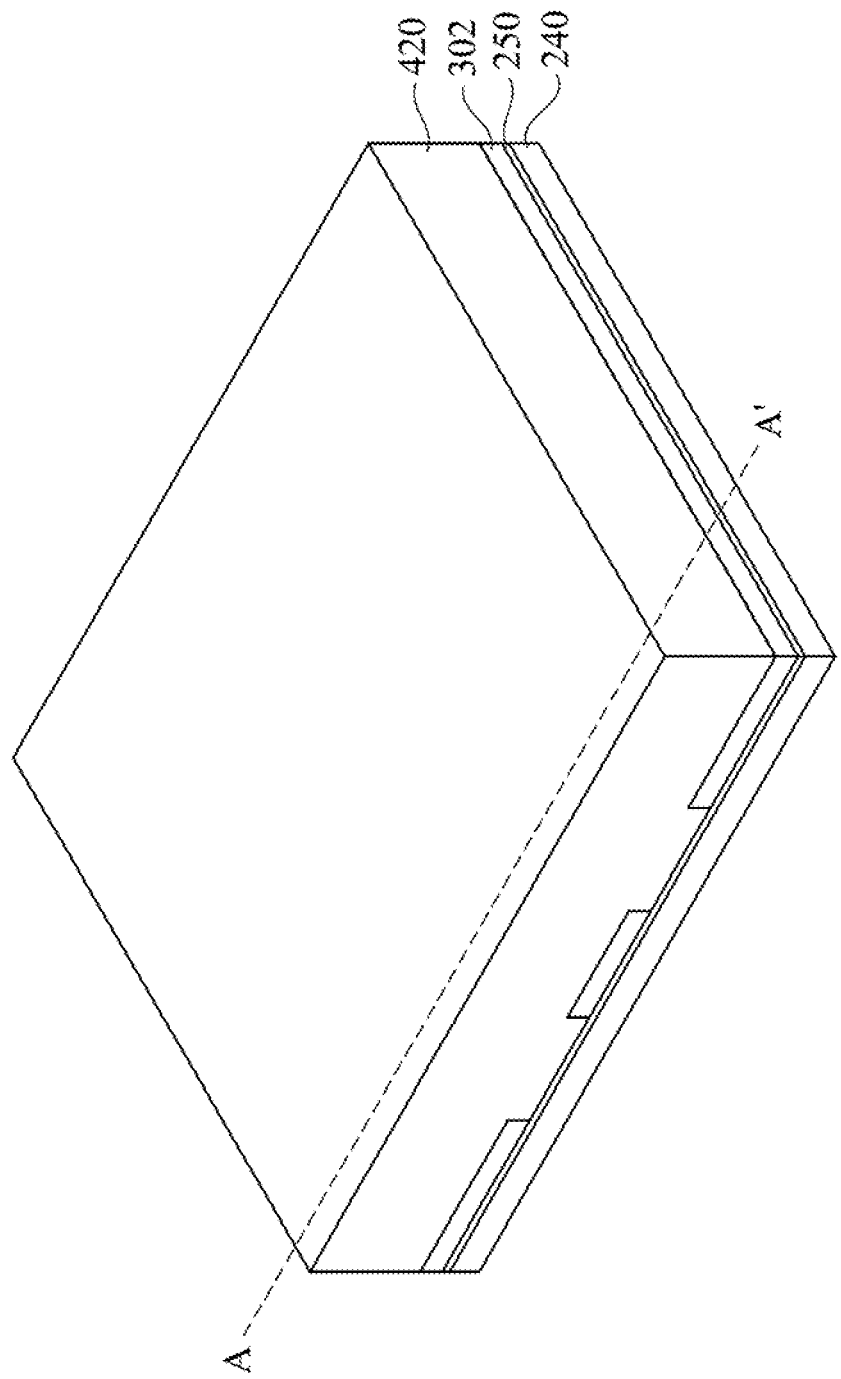
Figure 9B:
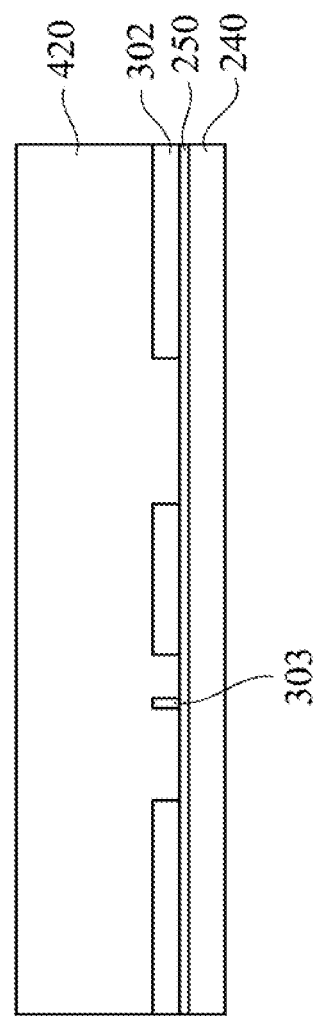
Figure 10A:
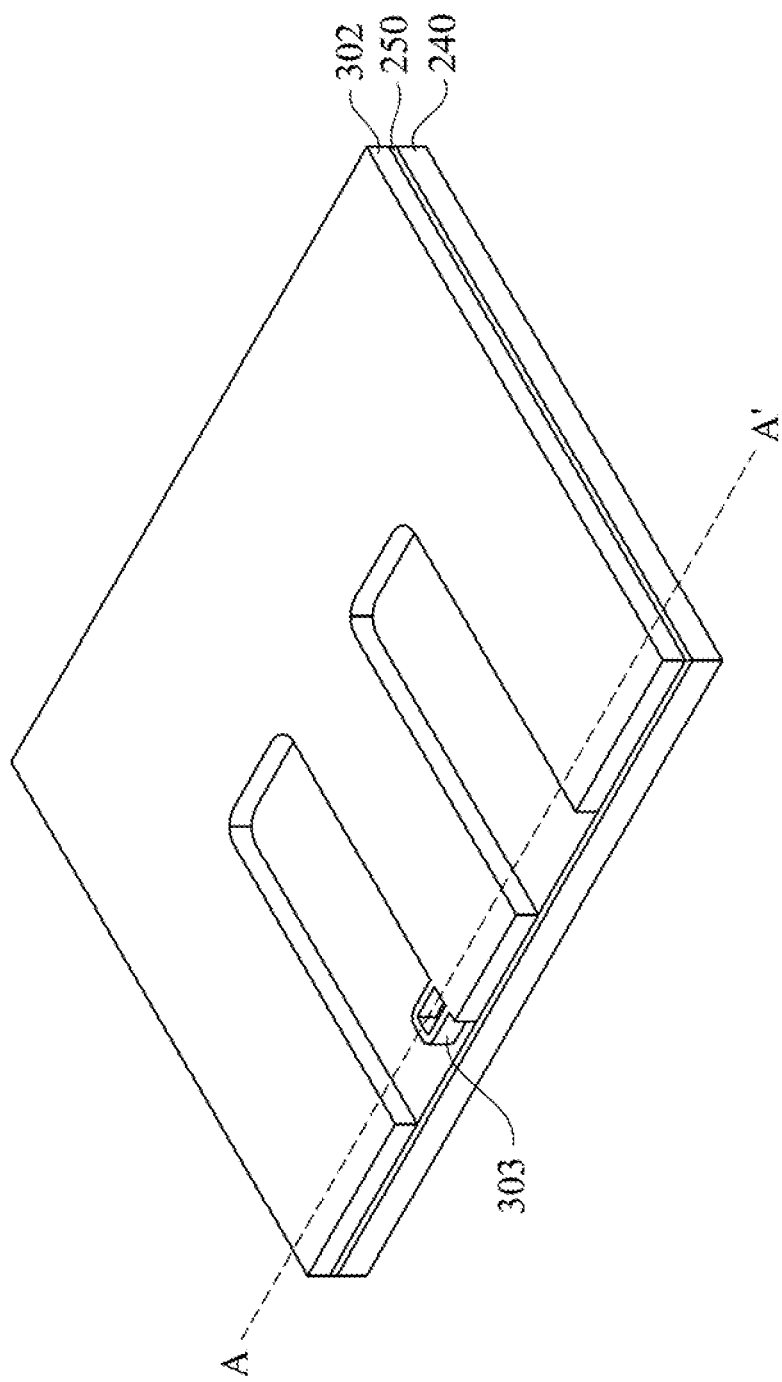
Figure 10B:
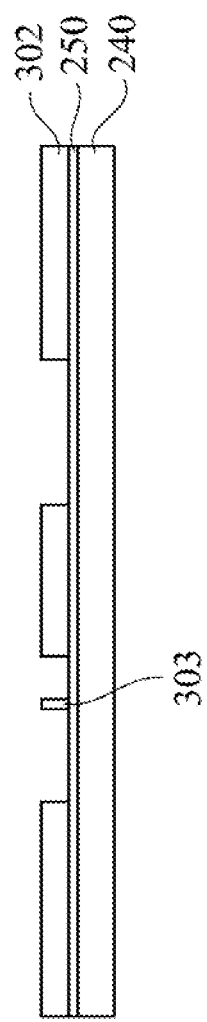

In some embodiments, the other portions of the first patterned target layer 302 may be patterned while the ring portion 303 of the first patterned target layer 302 is remained. FIGS. 9A and 10A are perspective views of two of various intermediate stages in the manufacturing of semiconductor structure according to some embodiments of the disclosure. FIGS. 9B and 10B are cross-sectional views taken along line A-A' of FIGS. 9A and 10A. Referring to FIG. 1 and FIGS. 9A-10B, in the optional operation 1016 of the method 1000, a fourth photoresist 420 with a fourth opening (not shown) is formed on the first patterned target layer 302. The ring portion 303 of the first patterned target layer 302 is covered by the fourth photoresist 420. Another portion of the first patterned target layer 302 (not shown) in the array circuit region may be exposed by the fourth opening to receive an additional patterning process without patterning the ring portion 303 protected by the fourth photoresist 420. For example, the other portion of the first patterned target layer 302 may be patterned into a plurality of island structures arranged in an array, while the ring portion 303 is remained as the shape shown in FIG. 8A. After the additional patterning process, the fourth photoresist 420 is then removed.

Figure 11A:
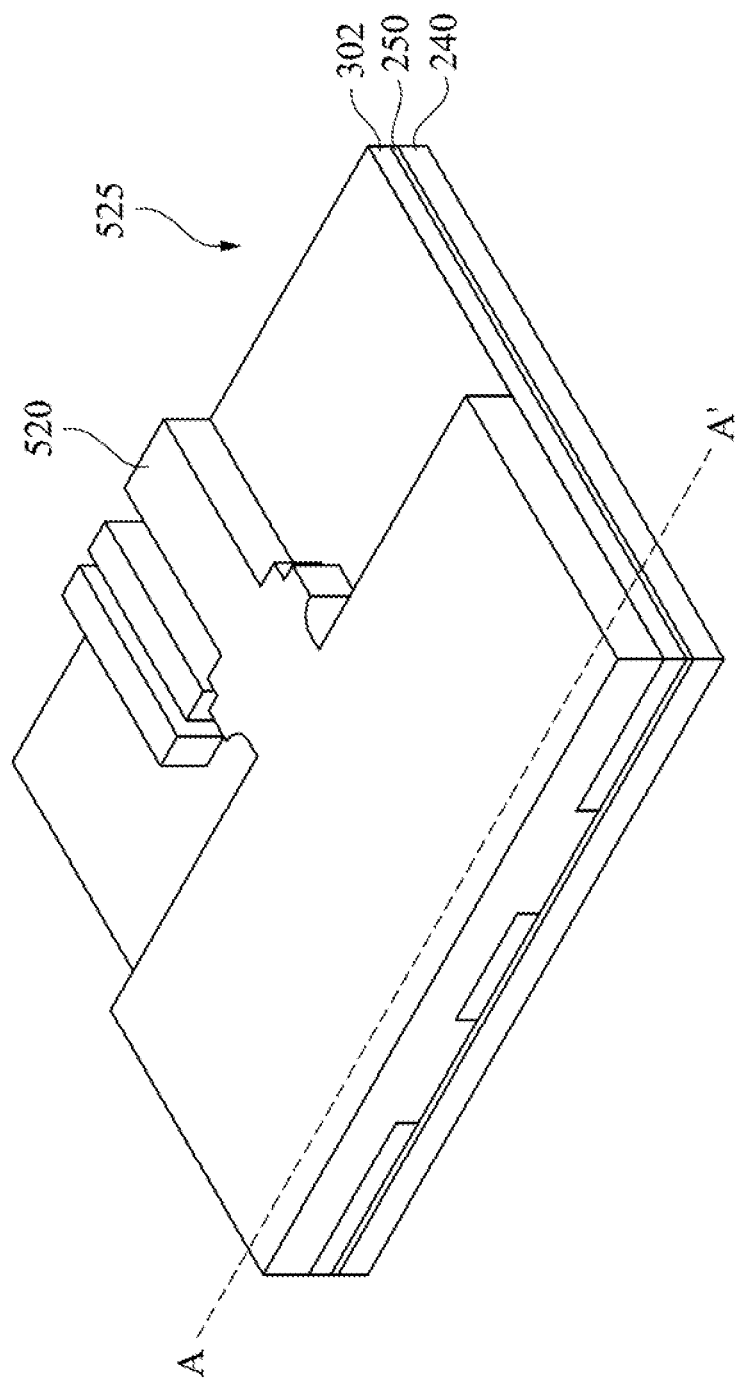
Figure 11B:
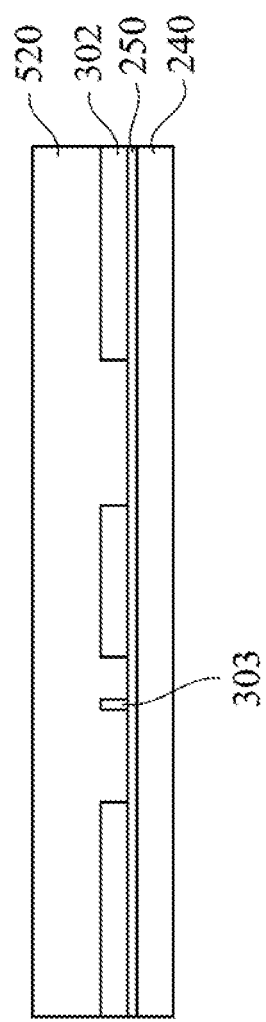
Figure 12A:
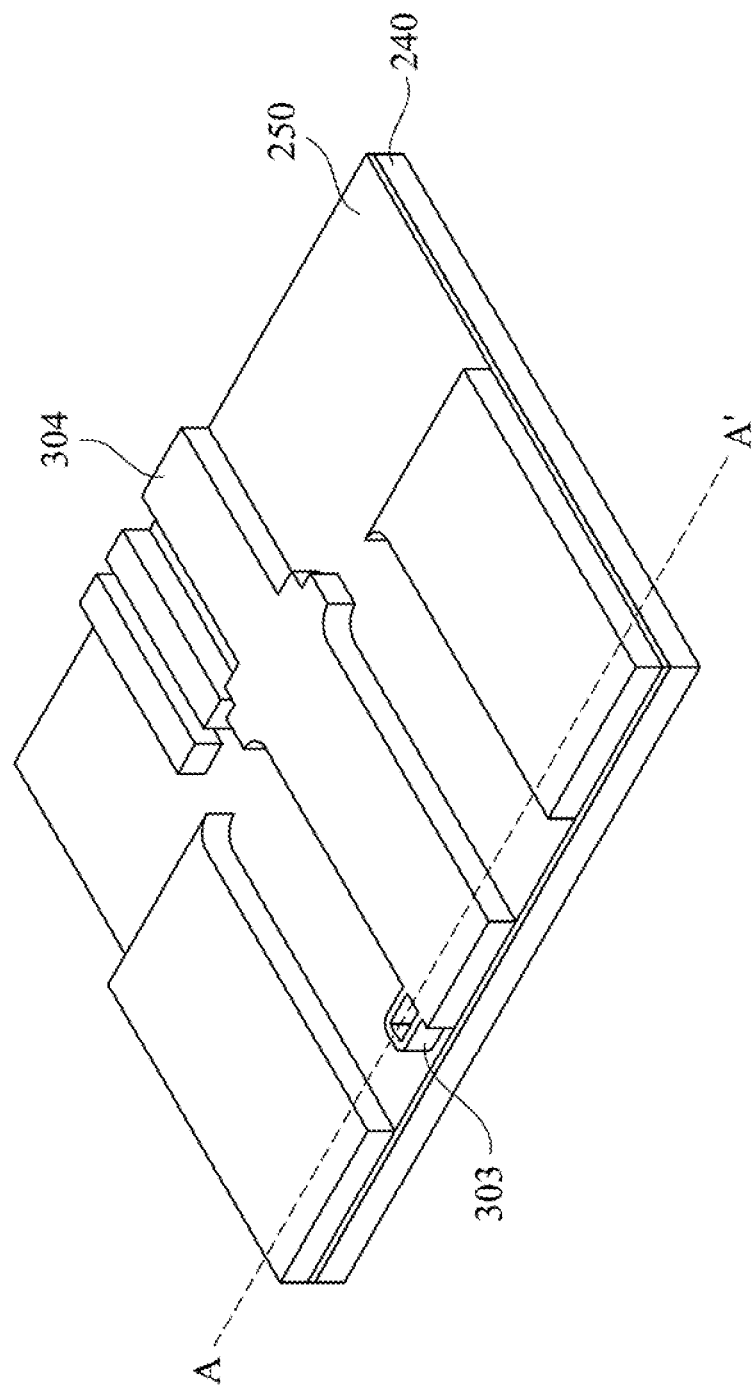
Figure 12B:
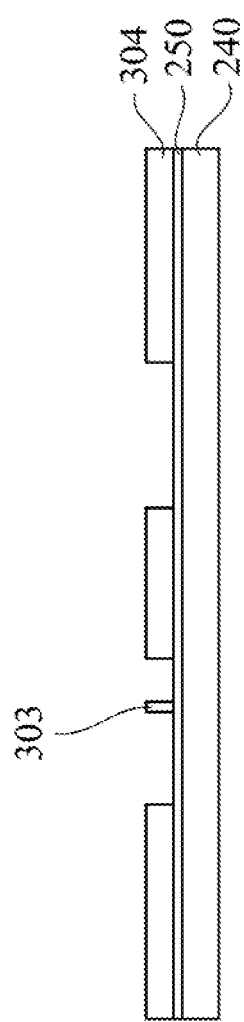

FIGS. 11A and 12A are perspective views of two of various intermediate stages in the manufacturing of semiconductor structure according to some embodiments of the disclosure. FIGS. 11B and 12B are cross-sectional views taken along line A-A' of FIGS. 11A and 12A. Referring to FIG. 1 and FIGS. 11A-12B, in the operation 1018-1020 of the method 1000, a third photoresist 520 with a third opening 525 is formed on the first patterned target layer 302, and the first patterned target layer 302 is patterned by the third photoresist 520 to form a second patterned target layer 304. Specifically, the first patterned target layer 302 in the periphery circuit region of the precursor memory structure is exposed by the third opening 525. As a result, the pattern of the third photoresist 520 would be transferred to the first patterned target layer 302 to form the second patterned target layer 304 above the periphery circuit region of the precursor memory structure. After the formation of the second patterned target layer 304, the third photoresist 520 is then removed. In some embodiments, the ring portion 303 of the first patterned target layer 302 may be covered by the third photoresist 520 so that the ring portion 303 is remained while the first patterned target layer 302 in the periphery circuit region is patterned. In some embodiments, the first patterned target layer 302 in the array circuit region of the precursor memory structure may be covered by the third photoresist 520 so that the first patterned target layer 302 in the array circuit region is remained while the first patterned target layer 302 in the periphery circuit region is patterned.

Figure 13A:
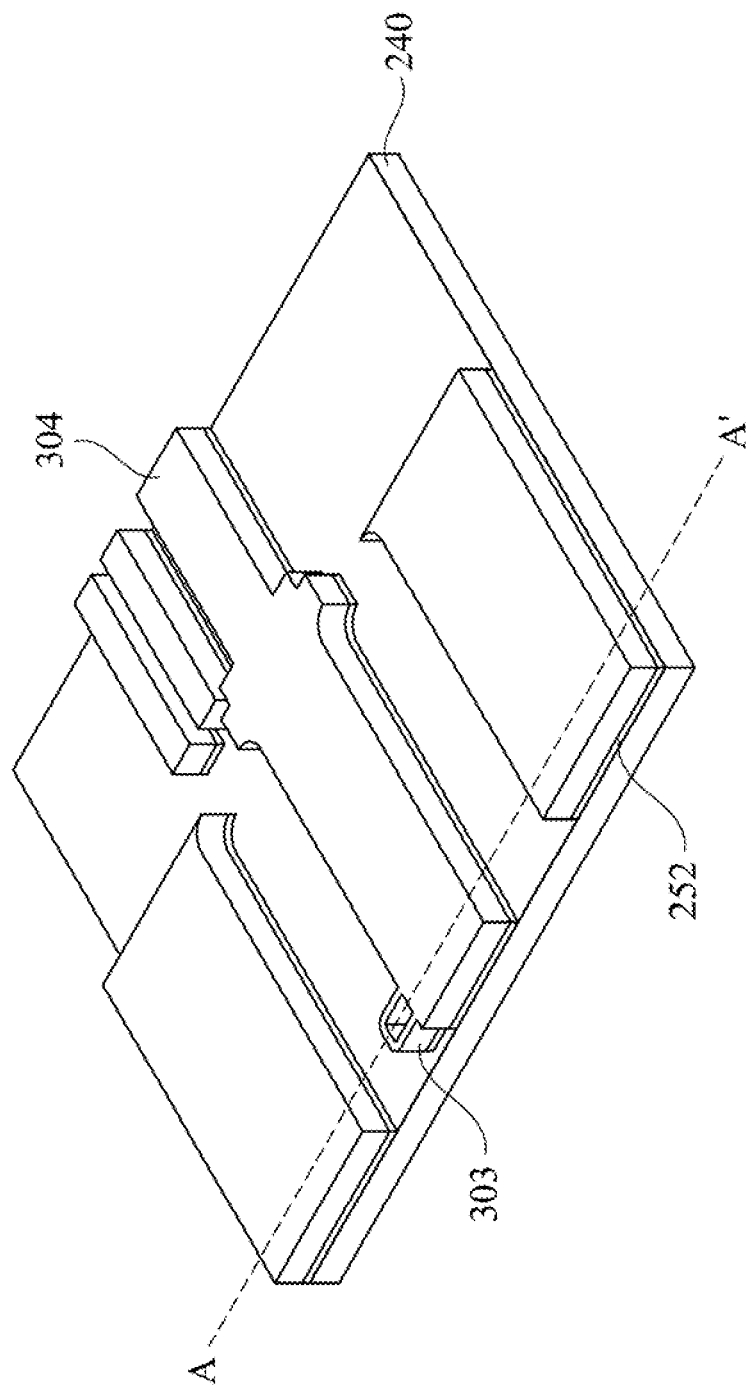
Figure 13B:
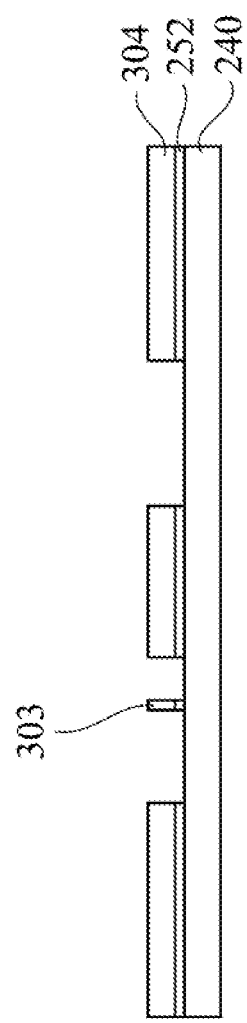
Figure 14A:
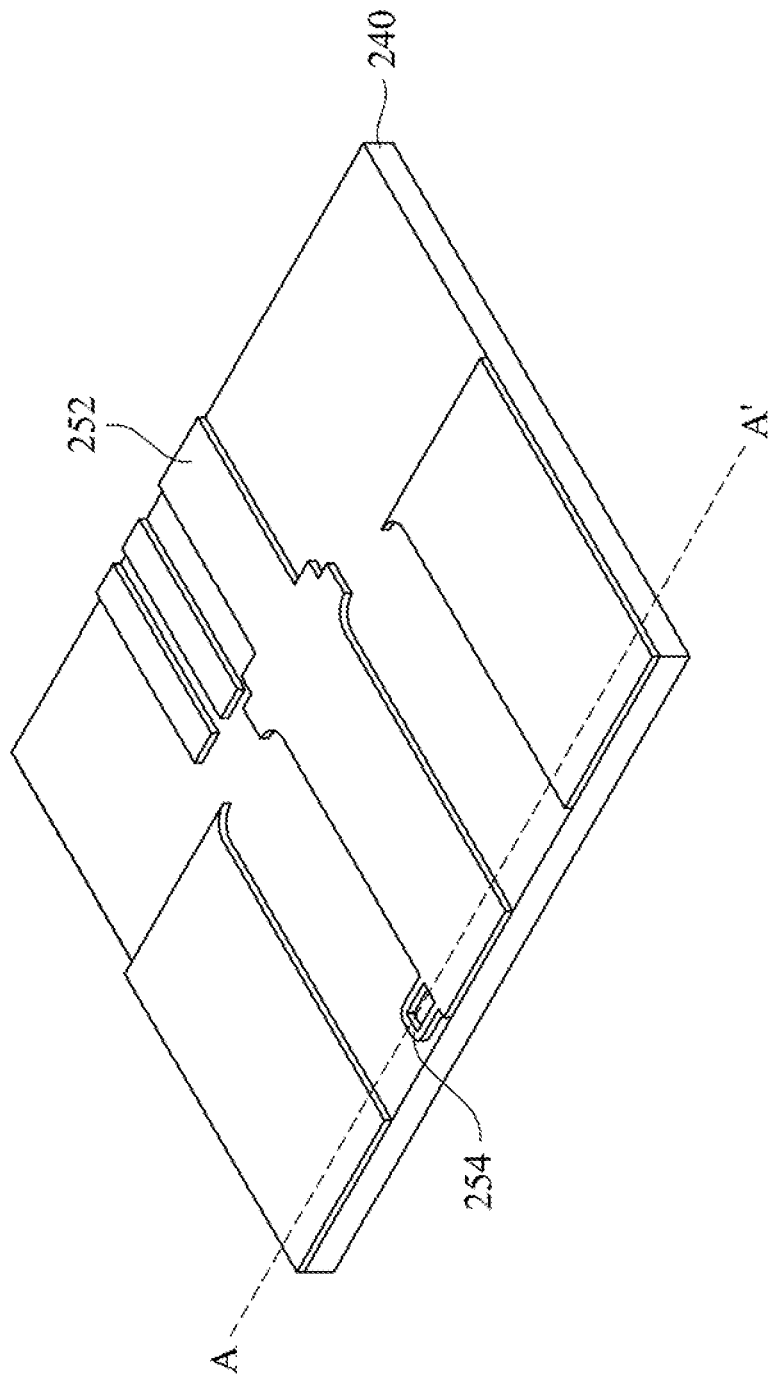
Figure 14B:
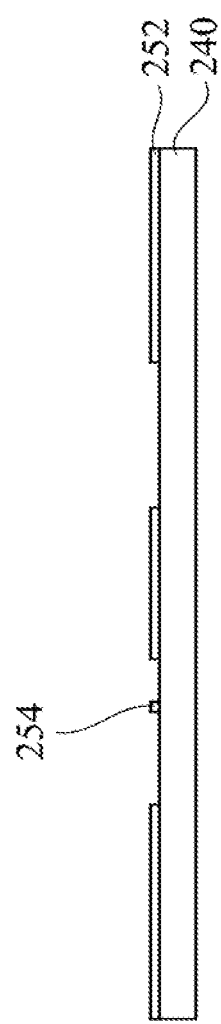

FIGS. 13A and 14A are perspective views of one of various intermediate stages in the manufacturing of semiconductor structure according to some embodiments of the disclosure. FIGS. 13B and 14B are cross-sectional views taken along line A-A' of FIGS. 13A and 14A. Referring to FIG. 1 and FIGS. 13A-14B, in the operation 1022 of the method 1000, the conductive layer 250 is patterned by the second patterned target layer 304 to form a patterned conductive layer 252 on the precursor memory structure. As shown in FIGS. 13A-13B, the second patterned target layer 304 includes a pattern of the ring portion 303 and a pattern in the periphery circuit region. The patterns are transferred to the underlying conductive layer 250, and the patterned conductive layer 252 is formed. As a result, the patterned conductive layer 252 includes a ring structure 254 formed by the ring portion 303 above the contact plug of the precursor memory structure, for example, the contact plug 242 shown in FIG. 2. In other words, the ring structure 254 may be aligned with the source/drain region below the contact plug. After the formation of the patterned conductive layer 252, the second patterned target layer 304 is then removed. In some embodiments, the pattern of the ring portion 303 is transferred to the conductive layer 250 to form the ring structure 254, so the ring structure 254 may a width similar to that of the ring portion 303. For example, the width of the ring structure 254 may be between 26 nm and 30 nm, so that the ring structure 254 has a suitable size to align with the source/drain regions of the precursor memory structure. In some embodiments, the ring structure 254 may have a shape similar to that of the ring portion 303, such as a round shape, a U-shape, a rectangular shape with round corner, or other suitable profiles.

Figure 15B:
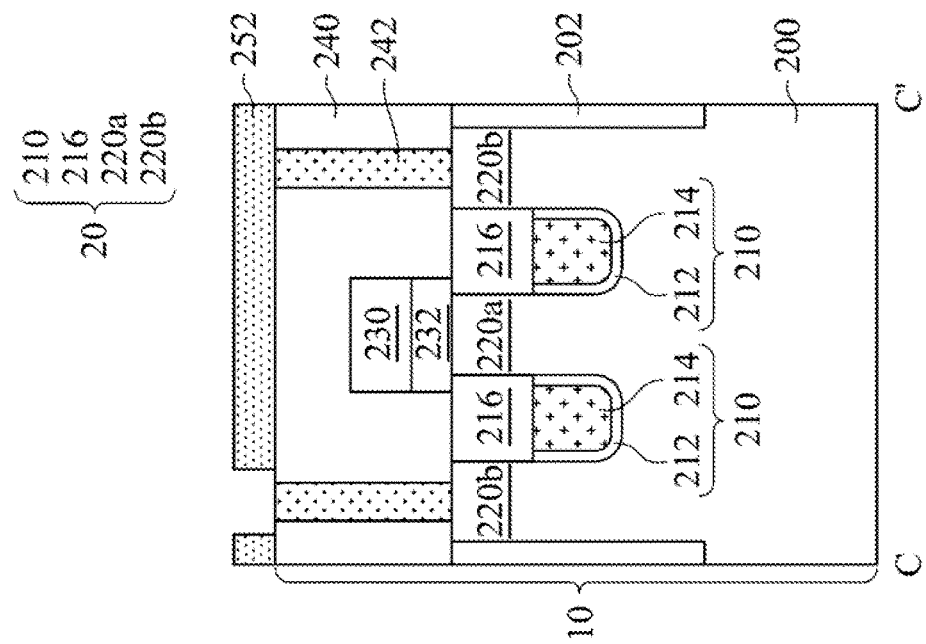
FIG. 15B is a cross-sectional view of a semiconductor structure according to some embodiments of the disclosure.
Figure 15A:
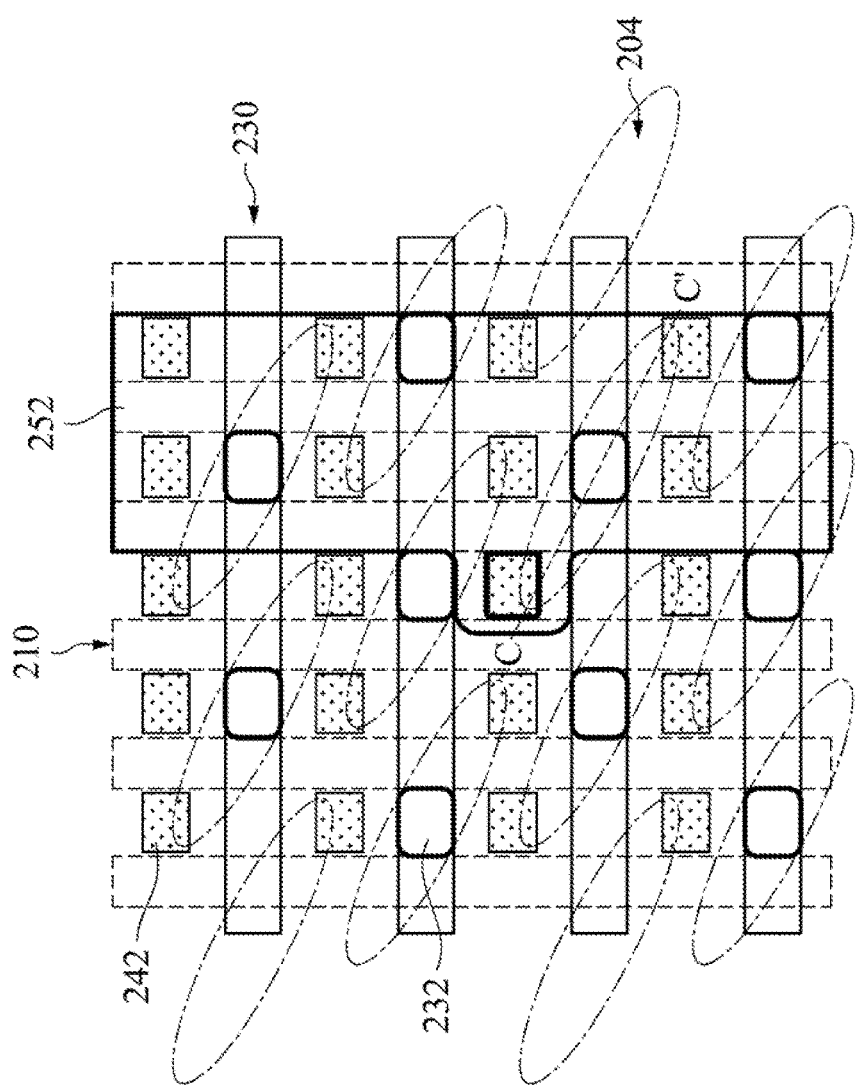
FIG. 15A is a schematic top view of a semiconductor structure according to some embodiments of the disclosure.

FIG. 15A is a schematic top view of the semiconductor structure manufactured by the method 1000 according to some embodiments of the disclosure. FIG. 15B is a cross-sectional view taken along line C-C' of FIG. 15A. Referring to FIG. 15A-15B, the semiconductor structure formed by the method 1000 includes a patterned conductive layer 252 disposed on the interlayer dielectric layer 240 of the precursor memory structure 10. The patterned conductive layer 252 is electrically connected to the transistors 20 through the contact plugs 242. Specifically, the patterned conductive layer 252 includes a ring structure 254 above one of the contact plugs 242, and the ring structure 254 is aligned with the source/drain region 220b below the one of the contact plugs 242. Because of the alignment between the ring structure 254 and the source/drain region 220b below the contact plug 242, the other portions of the patterned conductive layer 252 are able to be correspondingly aligned with other elements of the precursor memory structure 10. The well alignment between the patterned conductive layer 252 and the precursor memory structure 10 below would reduce the current leakage between them. For example, for the wafer including the precursor memory structure 10 and the patterned conductive layer 252, the current leakage may be avoided not only in the center region of the wafer but also the edge region of the wafer.

In some embodiments, the ring structure 254 is aligned with the source/drain region 220b below the contact plug 242 so that the aligned contact plug 242 may be exposed by the ring structure 254. For example, as shown in FIG. 15B, a projection of the ring structure 254 on the substrate 200 may surround the source/drain region 220b. As such, the contact plug 242 on that source/drain region 220b may be exposed by the opening of the ring structure 254. In some other embodiments, the ring structure 254 may be partially overlapped with the aligned contact plug 242 while the ring structure 254 is aligned with the source/drain region 220b below the contact plug 242. In some embodiments, the patterned conductive layer 252 may be overlapped with the bit line contact plugs 232. For example, as shown in FIG. 15B, a projection of the patterned conductive layer 252 on the substrate 200 may be overlapped with the bit line contact plug 232 and the bit line 230 on the bit line contact plug 232.

In some embodiments, the patterned conductive layer 252 may be electrically connected to the source/drain regions 220b through the contact plugs 242 that are not aligned with the ring structure 254. For example, the patterned conductive layer 252 may be connected to a power supply, so that the current may be provided from the patterned conductive layer 252 to the source/drain regions 220b through the contact plugs 242.

The present disclosure provides a semiconductor structure and a manufacturing method thereof. The semiconductor structure includes a patterned conductive layer disposed on a precursor memory structure, in which the patterned conductive layer includes a ring structure formed by a ring portion of a target layer. The ring portion is patterned by two photoresists exposing an array circuit region of the precursor memory structure, thereby allowing the ring structure to be aligned with a source/drain region of the precursor memory structure. Therefore, the other portions of the patterned conductive layer are able to be correspondingly aligned with the elements of the precursor memory structure. This provides a well alignment between the patterned conductive layer and the precursor memory structure, which reduces the current leakage and improves the performance of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a plurality of transistors disposed in a substrate, wherein each of the plurality of transistors comprises a gate structure and source/drain regions disposed at opposite sides of the gate structure;
an interlayer dielectric layer disposed above the substrate;
a plurality of contact plugs disposed in the interlayer dielectric layer, wherein the plurality of contact plugs are electrically connected to the source/drain regions of the plurality of transistors, respectively; and
a patterned conductive layer disposed on the interlayer dielectric layer and electrically connected to the plurality of transistors through the plurality of contact plugs, wherein the patterned conductive layer comprises a ring structure above a first contact plug of the plurality of contact plugs, and the ring structure is aligned with a first source/drain region of the source/drain regions of one of the plurality of transistors below the first contact plug.

2. The semiconductor structure of claim 1, wherein the first contact plug is exposed by the ring structure.

3. The semiconductor structure of claim 1, wherein the first source/drain region is surrounded by a projection of the ring structure on the substrate.

4. The semiconductor structure of claim 1, wherein the ring structure is partially overlapped with the first contact plug.

5. The semiconductor structure of claim 1, wherein a width of the ring structure is between 26 nm and 30 nm.

6. The semiconductor structure of claim 1, further comprising:
bit line disposed over the substrate; and
a plurality of bit line contact plugs disposed between the substrate and the bit line, wherein the bit line is electrically connected to the source/drain regions of one of the plurality of transistors disposed between two of the plurality of contact plugs through the plurality of bit line contact plugs.

7. The semiconductor structure of claim 6, wherein the patterned conductive layer is overlapped with the plurality of bit line contact plugs.

8. The semiconductor structure of claim 1, wherein the patterned conductive layer is electrically connected to the source/drain regions of the plurality of transistors through the plurality of contact plugs.

9. The semiconductor structure of claim 1, wherein the patterned conductive layer is connected to a power supply.

* * * * *